US008451619B2

(12) United States Patent
Kashiwakura (10) Patent No.: US 8,451,619 B2
(45) Date of Patent: *May 28, 2013

(54) PRINTED WIRING BOARD AND METHOD OF SUPPRESSING POWER SUPPLY NOISE THEREOF

(75) Inventor: Kazuhiro Kashiwakura, Tokyo (JP)

(73) Assignee: NEC Corporation (JP)

( * ) Notice: Subject to any disclaimer, the term of this patent is extended or adjusted under 35 U.S.C. 154(b) by 46 days.

This patent is subject to a terminal disclaimer.

(21) Appl. No.: 13/026,965

(22) Filed: Feb. 14, 2011

(65) Prior Publication Data

US 2011/0132640 A1    Jun. 9, 2011

Related U.S. Application Data

(63) Continuation of application No. 11/549,449, filed on Oct. 13, 2006, now Pat. No. 8,033,015.

(30) Foreign Application Priority Data

Oct. 18, 2005   (JP) .................................. 2005-303386

(51) Int. Cl.
*H05K 7/00*    (2006.01)

(52) U.S. Cl.
USPC ........... 361/777; 361/760; 361/768; 361/780; 361/794; 174/250; 174/260

(58) Field of Classification Search
USPC .................. 174/250, 260–262; 361/760, 767, 361/768, 777, 780, 794–795
See application file for complete search history.

(56) References Cited

U.S. PATENT DOCUMENTS

| 4,739,448 | A | 4/1988 | Rowe et al. .................... 361/386 |
| 5,012,047 | A | 4/1991 | Dohya .......................... 174/250 |
| 5,475,264 | A | 12/1995 | Sudo et al. .................... 257/723 |
| 5,629,559 | A | 5/1997 | Miyahara ....................... 257/666 |
| 5,639,989 | A | 6/1997 | Higgins, III ............. 174/35 MS |
| 5,708,296 | A | 1/1998 | Bhansali ....................... 257/698 |
| 6,084,779 | A | 7/2000 | Fang ............................. 361/763 |
| 6,091,310 | A | 7/2000 | Utsumi et al. .................. 333/12 |
| 6,121,554 | A | 9/2000 | Kamikawa .................... 174/260 |
| 6,229,095 | B1 | 5/2001 | Kobayashi .................... 174/255 |
| 6,483,714 | B1 | 11/2002 | Kabumoto et al. ........... 361/760 |
| 6,489,574 | B1 * | 12/2002 | Otaki et al. .................... 174/262 |
| 6,788,092 | B2 | 9/2004 | Cheng et al. ................... 324/765 |
| 6,800,814 | B2 | 10/2004 | Ohsaka ......................... 174/255 |
| 6,870,252 | B2 | 3/2005 | Novak et al. .................. 257/691 |
| 7,515,434 | B2 * | 4/2009 | Wyrzykowska et al. ...... 361/763 |
| 2003/0043560 | A1 * | 3/2003 | Clarkson et al. .............. 361/782 |

(Continued)

FOREIGN PATENT DOCUMENTS

| JP | 11-261238 | 9/1999 |
| JP | 2004/281768 | 10/2004 |

OTHER PUBLICATIONS

Japanese Official Action + translation, dated Mar. 29, 2011, issued in corresponding, JP2005-303386, (3 pgs).

*Primary Examiner* — Hoa C Nguyen
(74) *Attorney, Agent, or Firm* — Hayes Soloway P.C.

(57) ABSTRACT

Disclosed is a printed wiring board having signal layers each interposed between a power supply layer and a ground layer, wherein the signal layer includes at least one of a wiring region for a ground potential and a wiring region for a power supply potential.

10 Claims, 10 Drawing Sheets

U.S. PATENT DOCUMENTS

| | | | |
|---|---|---|---|
| 2003/0223208 A1* | 12/2003 | Wu et al. | 361/794 |
| 2004/0016117 A1* | 1/2004 | Wyrzykowska et al. | 29/852 |
| 2004/0099440 A1* | 5/2004 | Kwong et al. | 174/260 |
| 2004/0216916 A1* | 11/2004 | Wyrzykowska et al. | 174/255 |
| 2005/0263849 A1* | 12/2005 | Chang et al. | 257/532 |
| 2006/0065433 A1* | 3/2006 | Danoski et al. | 174/255 |

* cited by examiner

IMPEDANCE CHARACTERISTIC OF SUBSTRATE
(BETWEEN POWER SUPPLY AND GROUND)

FIG. 5

IMPEDANCE CHARACTERISTICS OF VARIOUS CAPACITORS

FIG. 6

SPECTRA OF POWER SUPPLY NOISE CURRENT

FIG. 7A  PRIOR ART

COMMON SUBSTRATE SECTION

FIG. 7B  PRIOR ART

SUBSTRATE SECTION 1 IN VIEW OF NOISE SUPPRESSION

FIG. 7C  PRIOR ART

SUBSTRATE SECTION 2 IN VIEW OF NOISE SUPPRESSION

FIG. 8

IMPEDANCE CHARACTERISTIC OF SUBSTRATE ALONE

FIG. 9

IMPEDANCE CHARACTERISTIC WHEN CAPACITORS ARE MOUNTED ON SUBSTRATE

FIG. 10

PRINTED WIRING BOARD AND METHOD OF SUPPRESSING POWER SUPPLY NOISE THEREOF

CROSS REFERENCE TO RELATED APPLICATION

This application is a continuation of U.S. application Ser. No. 11/549,449, filed Oct. 13, 2006, now U.S. Pat. No. 8,033,015 issued Oct. 11, 2011.

FIELD OF THE INVENTION

The present invention relates to a printed wiring board and a method of suppressing power supply noise thereof.

BACKGROUND OF THE INVENTION

Since a large amount of data is processed in electronic devices such as a communication device, a server, and a PC (personal computer), an operating frequency and a signal transfer rate of the electronic devices have risen. For this reason, power supply noise has also increased, so that a problem due to the power supply noise has also arisen. It is thus necessary to suppress the power supply noise to stabilize an operation of a product and to improve quality of the product.

Conventionally, a capacitor for absorbing the power supply noise from a semiconductor device (IC) and stabilizing an operation of the semiconductor device (IC) has been mounted around the IC. However, as the operation of the semiconductor device has become faster in recent years, a problem in which the capacitor does not serve as a bypass capacitor has arisen.

Figure 3:
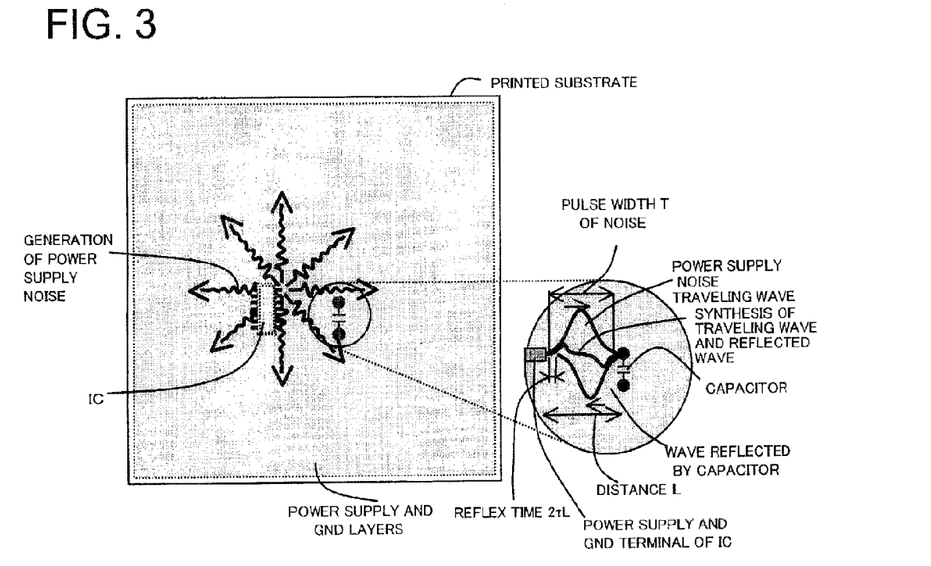
FIG. 3 is a schematic diagram showing a mechanism of absorbing power supply noise by a capacitor.

FIG. 3 is a diagram schematically illustrating a power supply noise absorbing mechanism using a capacitor. The power supply noise from a power supply and a GND terminal due to the operation of the IC propagates through an entire substrate through a power supply layer and a GND layer. This can be regarded as a transmission line having a two-dimensional space constituted from the power supply layer and the GND layer. When the capacitor (so-called "bypass capacitor") is present between the power supply layer and the GND layer that constitute the transmission line, a reduction in characteristic impedance caused by the capacitor occurs at that location. This can be regarded as the transmission line having an impedance mismatch at a midway point. Generally, when the impedance mismatch occurs on the transmission line, a reflected wave is generated.

When the characteristic impedance of the transmission line is indicated by $Z_0$, a characteristic impedance that has changed due to the capacitor is indicated by $Z_c$, and a voltage of the noise that propagates through the transmission line is indicated by $V_n$, a reflected voltage $V_r$ that has reflected due to the capacitor can be expressed by the following equation (1):

$$V_r = V_n \times (Z_c - Z_0)/(Z_c + Z_0) \quad (1)$$

When the impedance $Z_0$ is larger than the impedance $Z_c$, the reflected voltage $V_r$ becomes negative. When a distance between the power supply terminal of the IC and the capacitor is adequately short, the noise voltage $V_n$ and the reflected voltage $V_r$ are superimposed to each other. Then, a phenomenon arises in which the noise is reduced in the vicinity of the power supply terminal of the IC.

When the impedance $Z_c$ is adequately smaller than the impedance $Z_0$ in particular, the reflected voltage $V_r$ becomes equal to minus noise voltage $V_n$. Then, the noise voltage $V_n$ and the reflected voltage $V_r$ are cancelled out due to the superimposition. Ideally, the noise in the vicinity of the power supply terminal of the IC thereby becomes zero. As described above, an operation of the bypass capacitor can be made based on the principle of reflection.

Patent Document 1 discloses a configuration in which the power supply layer, a signal wiring layer, and a ground layer are mixed on the same layer of a printed wiring layer, and by effectively using a region for wiring on the substrate, the number of wiring layers can be reduced. This is the configuration in which the power supply layer, signal wiring layer, and ground layer are mingled on the same layer, and does not narrow a gap between the power supply layer and the ground layer.

[Patent Document 1]
JP Patent Kokai Publication No. JP-P-2004-281768A

SUMMARY OF THE DISCLOSURE

Figure 4:
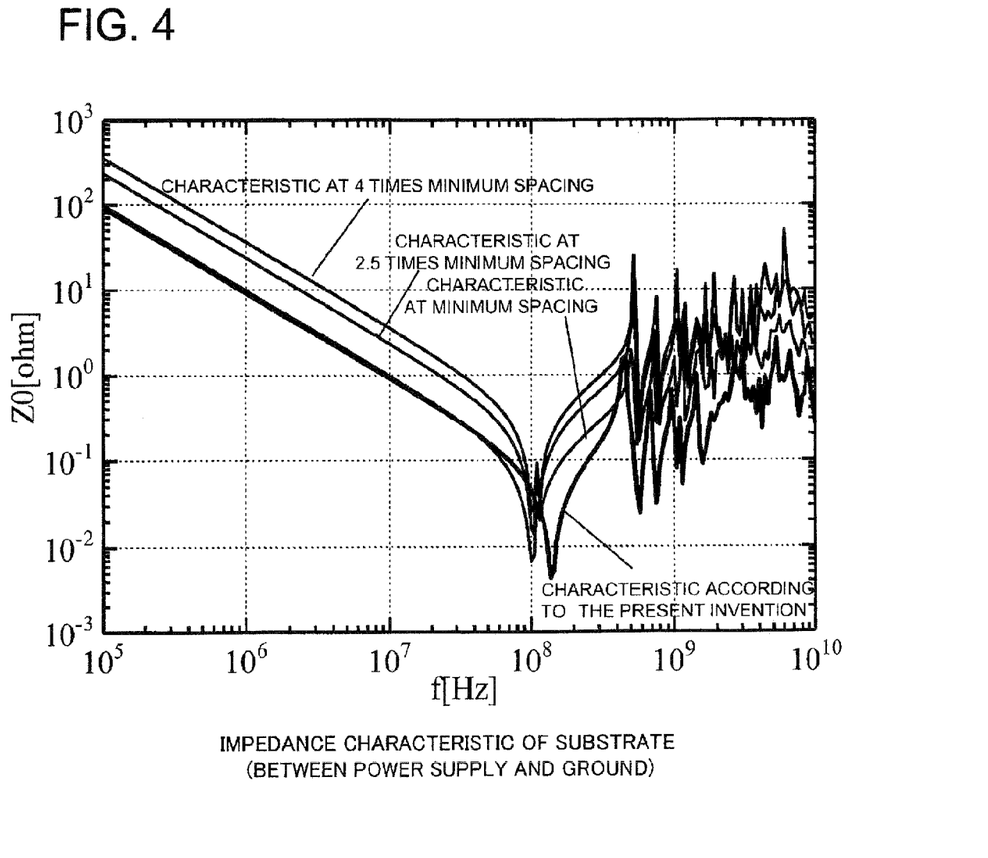
FIG. 4 is a diagram showing examples of analyses of impedance characteristics of a substrate (between a power supply and a ground)

The characteristic impedance of the printed wiring board including a GND layer and a power supply layer and the characteristic impedance of the capacitor will be examined in the below. FIG. 4 shows examples of analyses of impedance characteristics of the substrate (between the power source and a ground). A horizontal axis shows frequency, while a vertical axis shows impedance. FIG. 4 shows the characteristic of the present invention, which will be described later, as well.

Though the substrate is of the same shape, the gap between the power supply layer and the GND layer is changed (to the minimum spacing between the power source and the ground, 2.5 times the minimum spacing, and 4 times the minimum spacing to obtain the characteristics therein, respectively). It can be seen that the smaller the gap between the power supply layer and the GND layer is, the smaller the characteristic impedance becomes.

Figure 5:
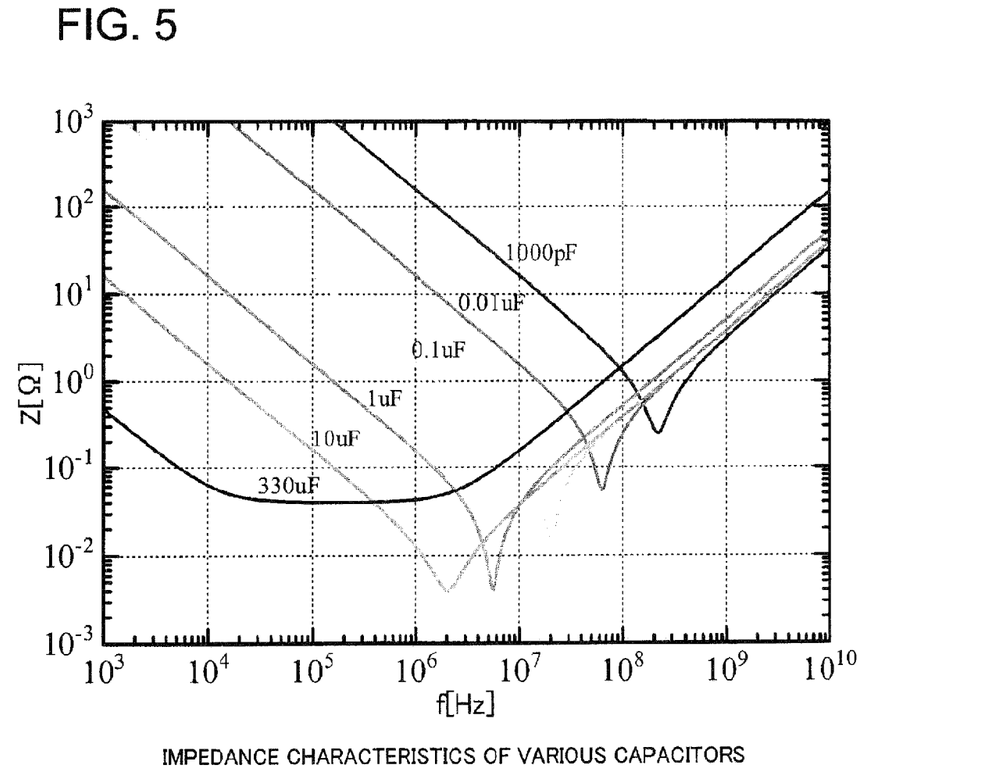
FIG. 5 shows examples of analyses of impedance characteristics of capacitors.

FIG. 5 shows examples of analyses of the impedance characteristics of the capacitors (of capacitances of 1000 pF, 0.01 µF, 0.1 µF, 1 µF, 10 µF, and 330 µF). According to the capacitance of a capacitor, a resonance frequency of the capacitor differs, and the characteristic impedance is reduced in the vicinity of the resonance frequency.

Further, when a comparison between FIG. 4 and FIG. 5 is made, the characteristic impedance of the capacitor exceeds the characteristic impedance of the substrate in the case of the frequency of several 100 MHz or higher. Accordingly, when the equation (1) is applied, the reflected voltage $V_r$ becomes positive, so that an effect of suppressing the power supply noise cannot be achieved. That is, in regard to a noise component of several 100 MHz or higher, the power supply noise using the capacitor (bypass capacitor) cannot well be suppressed.

In the semiconductor device, a rising transition becomes sharp at a time of signal switching, due to an increase of operation speed of the semiconductor device. For this reason, a frequency component of a power supply noise current also becomes higher.

Figure 6:
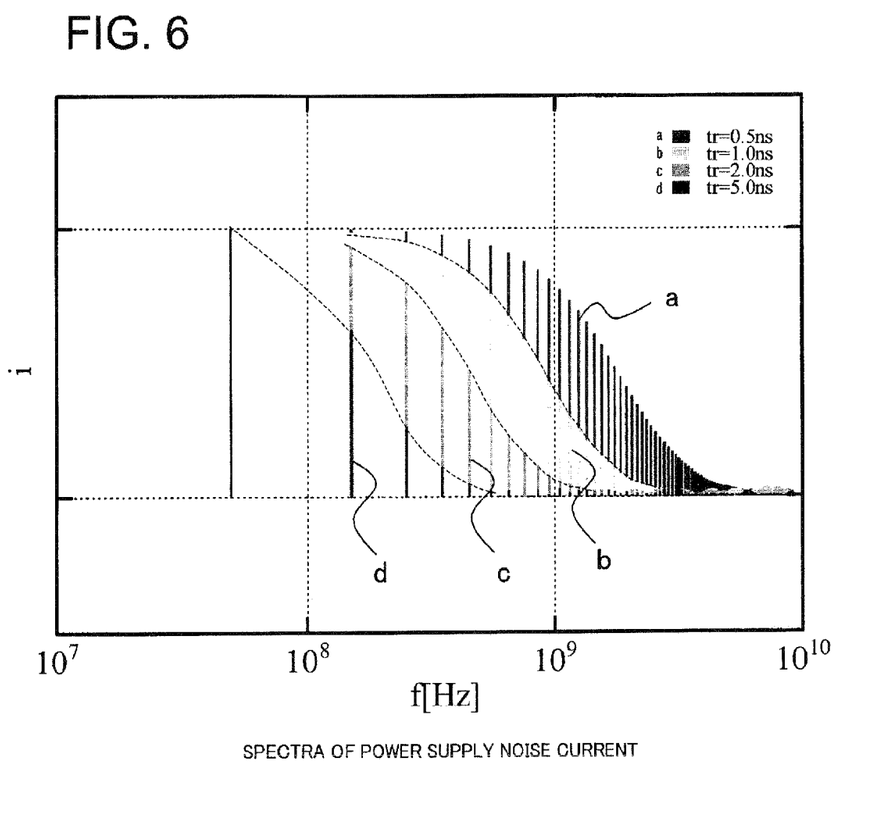
FIG. 6 is a graph showing spectra of a power supply noise current with respect to various rise times.

FIG. 6 shows examples of analyses of spectra of the power supply noise current in case a rise time tr of a 50-MHz signal (of a rectangular wave) supplied to the semiconductor device is changed (to 0.5 ns, 1.0 ns, 2.0 ns, and 5.0 ns). Referring to a graph of FIG. 16, a magnitude of a power supply current spectrum when the rise time tr is 0.5 ns, for example, is obtained by adding a component a to spectrum magnitude components b, c, and d when the rise times are 1.0 ns, 2.0 ns, and 5.0 ns, respectively.

Recently, there are a lot of semiconductor devices with the rise times tr thereof being faster than 1 ns, and as shown in FIG. 6, a power supply noise component of a frequency as high as several GHz is also present.

As described above, in regard to the noise component exceeding several 100 MHz, the capacitor cannot suppress the noise. Accordingly, the problem of the power supply noise has become serious.

According to the Ohms law, it is clear that the power supply noise increases in proportion to the characteristic impedance of the substrate. When a noise current is indicated by $I_n$, and the characteristic impedance of the substrate is indicated by $Z_0$, a power supply noise $V_n$ is given by the following equation (2). In order to suppress the power supply noise, it is advantageous to reduce the characteristic impedance $Z_0$ of the substrate:

$$V_n = Z_0 \times I_n \quad (2)$$

As seen from FIG. 4, the smaller the gap between the power supply layer and the GND layer is, the characteristic impedance of the substrate is reduced, so that the effect of suppressing the noise is high.

However, when the gap between the power supply layer and the GND layer of the substrate is reduced, another problem also arises. This problem will be described below.

Figure 7A:
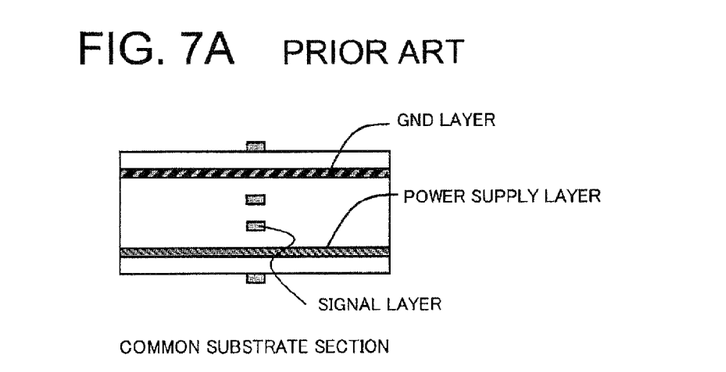
FIGS. 7A through 7C are diagrams showing examples of conventional configurations of a substrate.
Figure 7B:
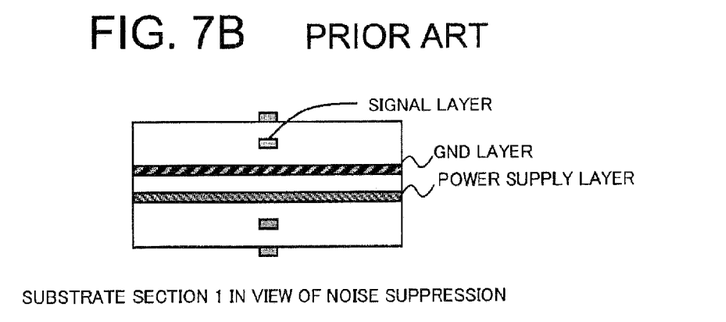

In order to further narrow the gap between the power supply layer and the GND layer of the substrate that has been traditionally constituted from six layers (formed of a component surface (on a first layer), the GND layer, a signal layer, a signal layer, the power supply layer, and a soldering surface (on a sixth layer)) as shown in FIG. 7A, for example, it has no choice to use a configuration in FIG. 7B. That is, the substrate is configured to include the component surface (on the first layer), signal layer, GND layer, power supply layer, signal layer, and soldering surface (on the sixth layer). In this case, signal wiring formed on the component surface (on the first layer) and signal wiring formed on the soldering surface (on the sixth layer) are separated from the GND layer and the power supply layer. Accordingly, the characteristic impedance of each signal wiring itself would be increased.

Figure 7C:
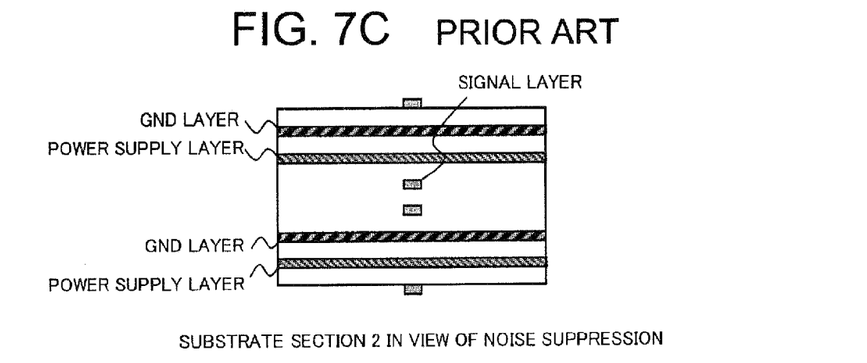

On the other hand, when the power supply layer and the GND layer are added as shown in FIG. 7C, the number of the layers of the substrate (which becomes eight layers in the case of FIG. 7C), is increased. A problem of an increase in cost is also caused.

As described above, it can be seen that when the gap between the power supply layer and the GND layer is narrowed by modifying the configuration of the substrate so as to suppress the power supply noise exceeding several 100 MHz, another problem will arise.

Accordingly, an object of the present invention is to provide a printed wiring board and a method of suppressing power supply noise thereof that can effectively suppress the power supply noise while suppressing an increase in cost.

The above and other objects are attained by a printed wiring board according to the present invention which includes at least one of a wiring region for a power supply potential and a wiring region for a ground potential in a predetermined free area provided on a signal layer thereof.

In the printed wiring board according to the present invention, the signal layer is interposed between a power supply layer and a ground layer through respective insulating layers.

It may be so configured that the printed wiring board according to the present invention includes:

a first power supply layer, a first signal layer, a first ground layer, a second power supply layer, a second signal layer, and a second ground layer laminated one atop another in order, through the respective insulating layers;

the first signal layer including a first wiring region for one of the power supply potential and the ground potential in the free area on the first signal layer;

the second signal layer including a second wiring region for the other of the power supply potential and the ground potential in the free area on the second signal layer.

In the printed wiring board according to the present invention, at least one part region of the signal layer immediately below a semiconductor device mounted on the printed wiring board is set to the free area.

It may be so configured that in the printed wiring board according to the present invention, a region on the signal layer corresponding to a region extended in four directions from a bottom center portion of a semiconductor device mounted on the printed wiring board is set to the free area.

It may be so configured that in the printed wiring board according to the present invention, the semiconductor device including a plurality of electrodes is mounted on a bottom surface facing a component surface of the printed wiring board;

the component surface of the printed wiring board includes a plurality of pads for being connected with the electrodes of the semiconductor device, respectively, and through holes connected to the pads, respectively, are arranged positioned in a periphery side of the semiconductor device with respect to the pads; and the region on the signal layer corresponding to the region extended in the form of a cross corresponding to vertical and horizontal center lines of the bottom surface of the semiconductor device is set to the free area.

In the printed wiring board according to the present invention, the free area may have a shape in which a width thereof is reduced, in incremental steps, from a region corresponding to the bottom center portion of the semiconductor device toward the periphery side of the semiconductor device.

It may be so configured that in the printed wiring board according to the present invention, the first wiring region is connected to a through hole for the one of the power supply potential and the ground potential, disposed in the vicinity of the first wiring region; and the second wiring region is connected to a through hole for the other of the power supply potential and the ground potential, disposed in the vicinity of the second wiring region.

It may be so configured that a printed wiring board according to the present invention includes at least one of a wiring region for a power supply potential and a wiring region for a ground potential in a free area of at least one of a component surface thereof and a soldering surface thereof.

In the printed wiring board according to the present invention, at least one part of the component surface immediately under a semiconductor device mounted on the printed wiring board may be set to the free area.

A method of suppressing power supply noise of a printed wiring board according to the present invention includes the steps of:

providing a free area on a signal layer; and providing at least one of a wiring region for a power supply potential and a wiring region for a ground potential in the free area of the signal layer.

In the method of suppressing power supply noise of a printed wiring board according to the present invention, the printed wiring board may be a multi-layer substrate including:

a power supply layer;

a ground layer; and the signal layer interposed between the power supply layer and the ground layer.

A method of suppressing power supply noise of a printed wiring board according to the present invention includes the step of:

providing at least one of a wiring region for a power supply potential and a wiring region that constitute a ground potential in a free area in at least one of a component surface of the printed wiring board and a soldering surface of the printed wiring board.

It may be so configured that the method of suppressing power supply noise of a printed wiring board according to the present invention includes the steps of:

laminating a first power supply layer, a first signal layer, a first ground layer, a second power supply layer, a second signal layer, and a second ground layer one atop another in order, through respective insulating layers;

providing a first wiring region for one of the power supply potential and the ground potential in the free area of the first signal layer; and providing a second wiring region for the other of the power supply potential and the ground potential in the free area of the second signal layer.

It may be so configured that in the method of suppressing power supply noise of a printed wiring board according to the present invention, a semiconductor device including a plurality of electrodes is mounted on a bottom surface facing a component surface of the printed wiring board;

the component surface of the printed wiring board includes a plurality of pads for being connected with the electrodes of the semiconductor device, respectively, and through holes connected to said pads, respectively, are arranged positioned in a periphery side of the semiconductor device with respect to the pads; and a region on the signal layer corresponding to a region extended in the form of a cross corresponding to vertical and horizontal center lines of the bottom surface of said semiconductor device is set to the free area.

It may be so configured that the method of suppressing power supply noise of a printed wiring board according to the present invention includes the steps of:

connecting the first wring region to a through hole for the one of the power supply potential and the ground potential, disposed in the vicinity of the first wiring region; and connecting the second wiring region to a through hole for the other of the power supply potential and the ground potential, disposed in the vicinity of the second wiring region.

The meritorious effects of the present invention are summarized as follows.

According to the present invention, a power supply pattern or a GND pattern is provided in a free area of the signal layer. The present invention can thereby effectively suppress power supply noise, while suppressing an increase in cost.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Preferred embodiments of the invention will be described with reference to appended drawings. The present invention includes a power supply wiring region (111)/ground wiring region (112) in a free area (110) on a signal layer (102) which is disposed between a power supply layer (101) and a ground layer (103). In the present invention, a region on the signal layer (102) corresponding to a region extended in four directions from a center portion of the bottom surface of a semiconductor device mounted on a printed wiring board is set to be the free area (110) that serves as the power supply wiring region/ground wiring region. This free area may be shaped such that by adjusting positions of pads and through holes corresponding to the pads, a width of the free area is reduced, in incremental steps, from the region corresponding to the bottom surface center portion of the semiconductor device toward a peripheral side of the semiconductor device.

Figures 1A, 1C:
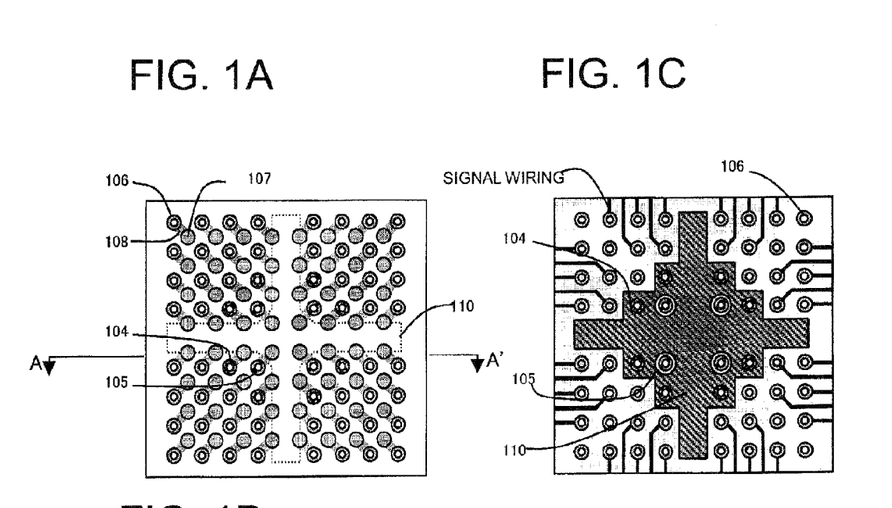
FIG. 1A is a perspective view seen from a component surface in an embodiment of the present invention.
FIG. 1C is a perspective view for explaining a wiring pattern of a signal layer 102 in FIG. 1B.
Figure 1B:
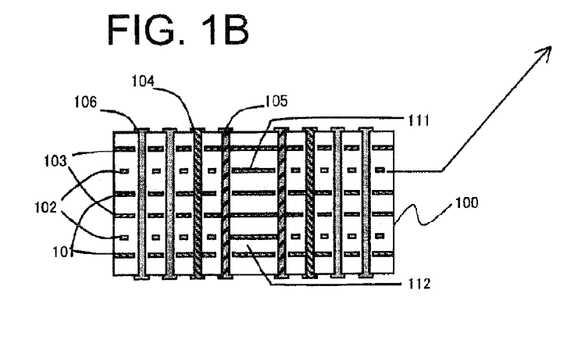
FIG. 1B is a sectional view taken along line A-A' of FIG. 1A.

FIG. 1A is a plan view showing an example of wiring pattern design of a printed wiring board according to an embodiment of the present invention, and is a perspective view as seen from a component side. FIG. 1B is a sectional view taken along a line A-A' of FIG. 1A. FIG. 1C is a plan view showing a surface of a signal layer in FIG. 1B (the signal layer 102 including power supply wiring 111 within the printed wiring board).

As shown in FIGS. 1A through 1C, in the present embodiment, a wiring pattern immediately below the semiconductor device in a BGA (Ball Grid Array) package, the power supply wiring region (wiring pattern) 111/GND wiring region (wiring pattern) 112 is disposed in the free area (power supply or GND wiring region on the signal layer) 110 on the signal layer 102 which is sandwiched between the power supply layer 101 and the GND layer 103. With this arrangement, a region, in which a characteristic impedance between a power supply and a GND is reduced, is formed to suppress high-frequency noise. In order to perform impedance matching among signal lines while maintaining an effect of suppressing power supply noise in a high frequency and also to avoid an increase in cost, the power supply wiring region 111 and the GND wiring region 112 are formed on the signal layers 102 in the vicinity of a power supply terminal (power supply through hole) 104 and a GND terminal (GND through hole) 105, respectively. That is, in the present embodiment, the GND wiring region 112 in the free area 110 on the signal layer 102 is connected to the GND through hole 105 in the vicinity. Further, as shown in FIG. 1C, the power supply wiring region 110 on the signal layer (which is a power supply wiring region disposed in the free area 110 on the signal layer 102 and corresponds to the power supply wiring 111 shown in a section in FIG. 1B) is electrically connected to the power supply through hole 104.

In the present embodiment, in each of the regions of the signal layers 102 including the power supply wiring region 111 and the GND wiring region 112, respectively, a gap between the power supply and the GND becomes narrower than in other regions. Accordingly, the characteristic impedance can be reduced locally, as shown in FIG. 4 as the present invention. As explained as a principle of a bypass capacitor, negative reflection is generated in a region with low impedance. Then, this negative reflection and the noise that generates the negative reflection are superimposed. The noise can be thereby allowing suppressed.

With the increase in the operation speed of semiconductor devices, a BGA package is widely adopted as a semiconductor package. When mounted, each terminal of a BGA is connected to a corresponding through hole 106 from a terminal pad through an outgoing line 108, and is connected to a signal, the power supply, or the GND in each of layers.

When the outgoing lines 108 are routed in the present embodiment, they are pulled out in a radial form from a center side of an IC toward the periphery side. The free area (for the power supply or GND wiring region on the signal layer) 110 in the shape of a cross can be thereby secured on the signal layer 102. Though no specific limitation is imposed, the region 110 in an example in FIG. 1C, becomes a shape in which a width of each side of the cross that extends in four directions is reduced, in incremental steps, from the center side of the IC toward the periphery side of the IC. In the present invention, the shape of the free area is as a matter of course not limited to the cross shape. Even if the cross-shaped free area 110 is not used, signal lines can be pulled out from terminals.

An example shown in FIG. 1B includes a component surface (constituting a first one layer), a GND layer 103, a signal layer 102, a power supply layer 101, the GND layer 103, the signal layer 102, a power supply layer 101, and a soldering surface (constituting an eighth layer). The region (power supply or GND wiring region on the signal layer) 110 on the signal layer 102 for the three layers is set to the power supply wiring region 111, while the region 110 on the signal layer 102 for the six layers is set to the GND wiring region 112.

With this arrangement, the characteristic impedance between the power supply and the GND in the region (for the power supply/GND wiring region on the signal layer) 110 can be reduced, so that the same effect as that of the bypass capacitor can be brought about.

In order to cause the noise and a reflected wave to be superimposed, thereby canceling out for a peak of the noise, a distance between the IC and the power supply wiring region 111 and a distance between the IC and the GND wiring region 112 need to be reduced.

When it is assumed that a noise is of a half-wave length of a sinusoidal wave, a pulse width of the noise is indicated by T (that is equal to a half period), a distance between a power supply terminal of the IC (or the GND terminal) that is a noise source and the pattern of the power supply wiring region 111 (or the pattern of the GND wiring region 112) is indicated by L, and a propagation delay time per unit length of the noise is indicated by t, it is necessary to cause a T/2 point (one quarter period), which is the peak of the noise, to be superimposed on the reflected voltage. Thus, the following expression (3) needs to be satisfied.

$$T/2 > 2\tau L \quad (3)$$

Herein, using a wave length λ of the noise, a velocity of light c, and a relative permittivity ε, and using the following equations, $$T = \sqrt{(\epsilon)} \cdot \lambda/(2c) \quad (4)$$

$$\tau = \sqrt{(\epsilon)}/c \quad (5)$$

the following relationship is derived:

$$L < \lambda/8 \quad (6)$$

It means that in a glass epoxy substrate, in order to suppress a noise component of 1 GHz, it is necessary to incorporate this pattern within the distance of two centimeters or less.

By forming the pattern of the GND wiring region 112 or the pattern of the power supply wiring region 111 in the free area (power supply or GND wiring region on the signal layer) of the signal layer 102 immediately below the IC as shown in FIG. 1, the characteristic impedance of the power supply layer 101 or the GND layer 103 in this portion becomes locally small.

When the noise propagates to the portion of locally small characteristic impedance from the noise source such as the IC, the negative reflection is generated in view of equation (1), because the characteristic impedance is smaller than in a surrounding region.

The noise source and the portion of locally reduced characteristic impedance satisfy the relationship (6), thereby allowing reduction of the noise in the vicinity of the noise source due to superimposition of the noise and the reflected wave.

Figure 8:
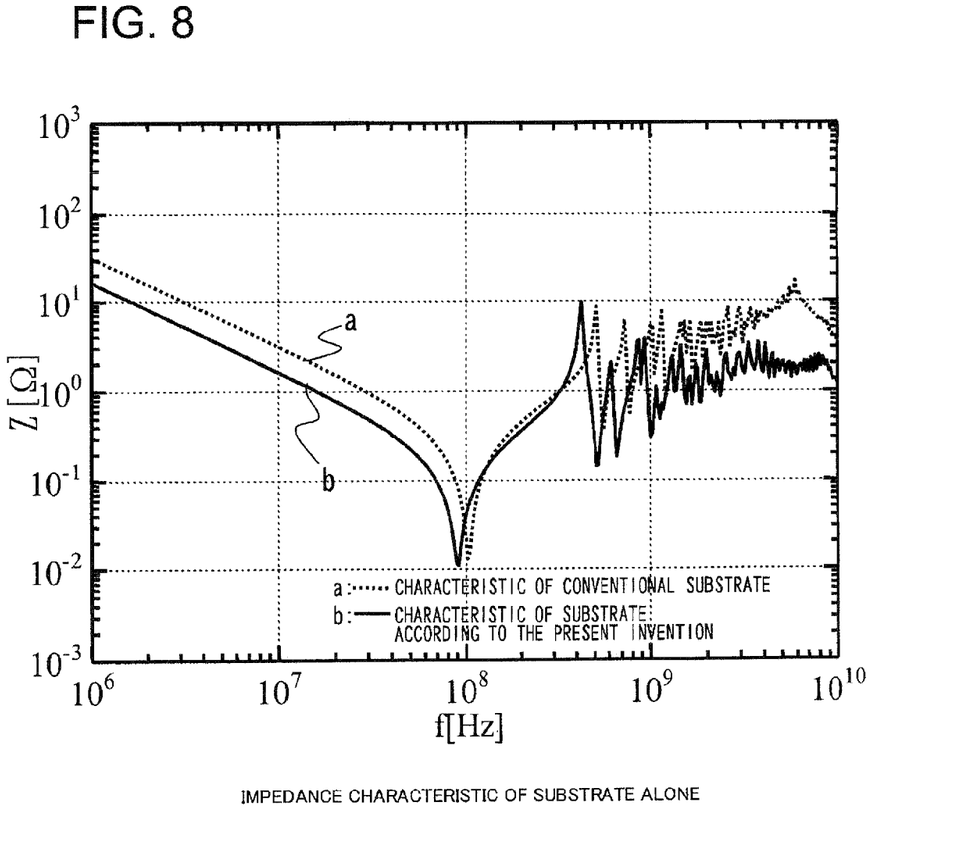
FIG. 8 is a diagram showing impedance characteristics when the substrates alone in the present invention and an example of comparison are used.
Figure 9:
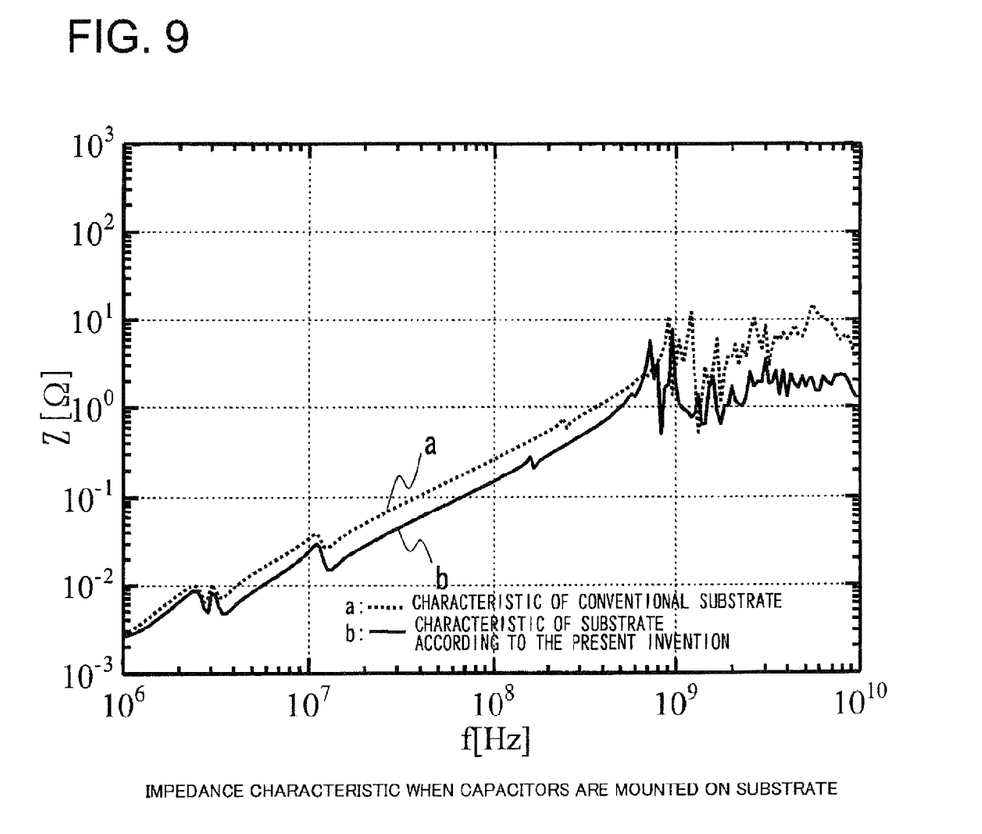
FIG. 9 is a diagram showing impedance characteristics when capacitors are mounted on each of the substrates in the present invention and an example of comparison.
Figure 10:
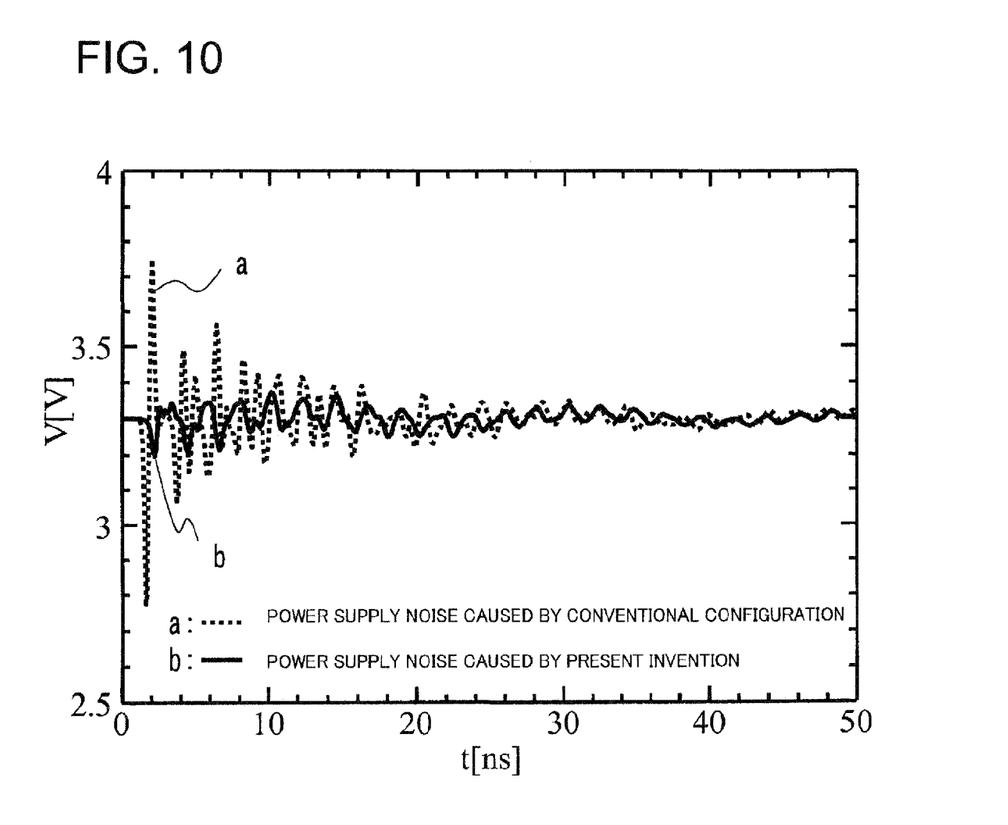
FIG. 10 is a diagram showing voltage waveforms of power supply noise in the present invention and an example of comparison.

FIGS. 8 and 9 show an impedance characteristic (a characteristic a) of the substrate to which the present invention has not been applied as an example of comparison, and an impedance characteristic (a characteristic b) of the substrate to which the present invention has been applied. FIG. 8 shows the comparison between the characteristics when the substrates alone are used. FIG. 9 shows the comparison when a plurality of capacitors of capacitances are mounted as a bypass capacitor. FIG. 10 shows an example of a voltage waveform (a waveform a) of the power supply noise of the substrate to which the present invention is not applied as an example of the comparison, and an example of a voltage waveform (a waveform b) of the power supply noise of the substrate to which the present invention has been applied.

It can be seen that in either case, the present invention has an effect of reducing the characteristic impedance of 1 GHz or higher. On contrast therewith, in the case of the examples of the comparison to which the present invention is not applied, the characteristic impedance in a band of 1 GHz or higher cannot be reduced by the capacitor alone.

As shown in FIG. 6, a rise time of the semiconductor device in recent years has become faster and a high frequency component of the power supply current of the semiconductor device has become higher. The actual power supply noise is computed using equation (2), so that it can be seen that reduction of the characteristic impedance of the substrate has the effect of suppressing the power supply noise.

Further, as described before, suppression of the noise by the bypass capacitor cannot be expected in the band of 1 GHz or higher. On contrast therewith, it can be seen that the present invention having a configuration of reducing the characteristic impedance of the substrate itself is effective.

Though a design example of the BGA package was shown in the embodiment described above, other package can be of course applied.

Figure 2A:
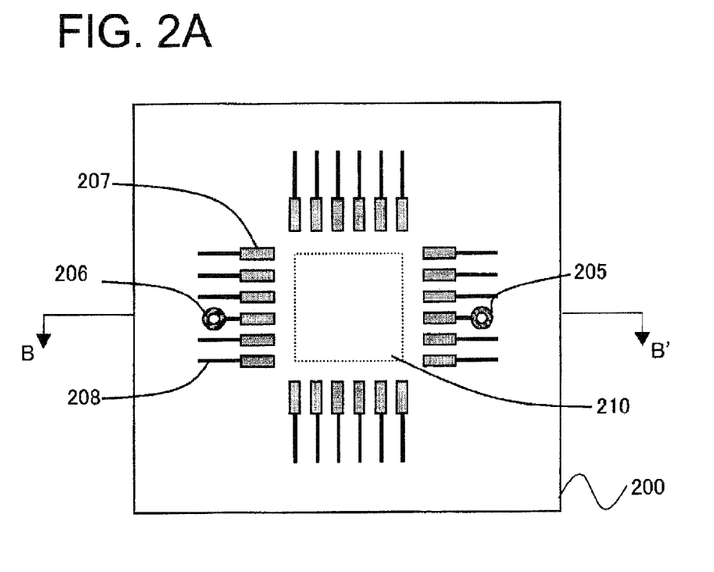
FIG. 2A is a perspective view seen from a component surface in other embodiment of the present invention.
Figure 2B:
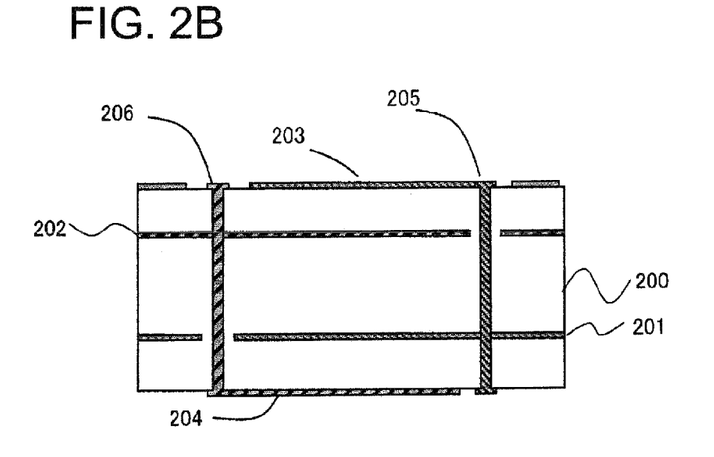
FIG. 2B is a sectional view taken along line B-B' of FIG. 2A.

FIG. 2 includes diagrams showing an example of a QFP (Quad Flat Package) package. FIG. 2A is a plan view, and FIG. 2B is a diagram showing a section along line B-B' of FIG. 2A. Since the QFP is employed for the substrate of multiple layers of a low height, an internal layer may not be present. In this case, a region 210 of one layer immediately under components or a free area of a soldering surface can be utilized. As shown in FIG. 2, power supply wiring 203 is provided on the surface of the substrate immediately under the components, and GND wiring 204 is provided on a corresponding region of an underside (soldering surface). The power supply wiring 203 is connected to a power supply through hole 205. The GND wiring 204 is connected to a GND through hole 206.

The above description was given in line with the embodiments described above. The present invention is not limited to configurations of the above-mentioned embodiments alone, and of course includes various variations and modifications that could be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A printed wiring board including at least one power supply wiring region and a ground wiring region in a predetermined free area provided on a signal layer thereof, wherein the signal layer is interposed between a power supply layer and a ground layer through respective insulating layers, wherein a region on the signal layer corresponding to a region extended in four directions from a bottom center portion of a semiconductor device mounted on said printed wiring board is set to the free area which includes at least one of the wiring region for the power supply re ion and the ground wiring region, and wherein the semiconductor device including a plurality of electrodes is mounted on a bottom surface facing a component surface of said printed wiring board;
said component surface of said printed wiring board includes a plurality of pads for being connected with said electrodes of the semiconductor device, respectively, and through holes connected to said pads, respectively, are arranged in a periphery side of the semiconductor device with respect to said pads; and
the region on the signal layer corresponding to the region extended in the form of a cross corresponding to vertical and horizontal center lines of said bottom surface of the semiconductor device is set to the free area.

2. The printed wiring board according to claim 1, comprising:
a first power supply layer, a first signal layer, a first ground layer, a second power supply layer, a second signal layer, and a second ground layer, laminated one atop another in order, through the respective insulating layers; wherein
said first signal layer includes a first wiring region for one of the power supply wiring region and the ground wiring region in the free area provided on said first signal layer; and
said second signal layer includes a second wiring region for the other of the power supply wiring region and the ground wiring region in the free area provided on said second signal layer.

3. The printed wiring board according to claim 2, wherein said first wiring region is connected to a through hole for the one of the power supply wiring region and the ground wiring region, disposed in the vicinity of said first wiring region; and
said second wiring region is connected to a through hole for the other of the power supply wiring region and the ground wiring region, disposed in the vicinity of said second wiring region.

4. The printed wiring board according to claim 1, wherein at least one part region of the signal layer immediately below a semiconductor device mounted on said printed wiring board is set to the free area, said one part region of the signal layer including at least one of a wiring region for the power supply wiring region and a wiring region for the ground wiring region.

5. The printed wiring board according to claim 1, wherein the free area has a shape in which a width thereof is reduced, in incremental steps, from a center portion of the bottom surface of the semiconductor device toward the periphery side of the semiconductor device.

6. A printed wiring board including at least one of a wiring region for a power supply wiring region and a ground wiring region in a free area of at least one of a component surface thereof and a soldering surface thereof, wherein the signal layer is interposed between a power supply layer and a ground layer through respective insulating layers, wherein a region on the signal layer corresponding to a region extended in four directions from a bottom center portion of a semiconductor device mounted on said printed wiring board is set to the free area which includes at least one of the wiring region for the power supply wiring region and the ground wiring region, and wherein the semiconductor device including a plurality of electrodes is mounted on a bottom surface facing a component surface of said printed wiring board;
said component surface of said printed wiring board includes a plurality of pads for being connected with said electrodes of the semiconductor device, respectively, and through holes connected to said pads, respectively, are arranged in a periphery side of the semiconductor device with respect to said pads; and
the region on the signal layer corresponding to the region extended in the form of a cross corresponding to vertical and horizontal center lines of said bottom surface of the semiconductor device is set to the free area.

7. The printed wiring board according to claim 6, wherein at least one part region of said component surface immediately under a semiconductor device mounted on said printed wiring board is set to said free area.

8. A method of suppressing power supply noise of a printed wiring board, said method comprising the steps of:
providing a predetermined free area on a signal layer interposed between a respective power supply layer and a separate respective ground layer; and
providing at least one of a wiring region for power supply connections and a wiring region for ground connections in said predetermined free area of the signal layer, wherein a region on the signal layer corresponding to a region extended in four directions from a bottom center portion of a semiconductor device mounted on said printed wiring board is set to the free area which includes at least one of the wiring region for the power supply wiring region and the ground wiring region, and wherein the semiconductor device including a plurality of electrodes is mounted on a bottom surface facing a component surface of said printed wiring board;

said component surface of said printed wiring board includes a plurality of pads for being connected with said electrodes of the semiconductor device, respectively, and through holes connected to said pads, respectively, are arranged in a periphery side of the semiconductor device with respect to said pads; and the region on the signal layer corresponding to the region extended in the form of a cross corresponding to vertical and horizontal center lines of said bottom surface of the semiconductor device is set to the free area.

9. The method according to claim 8, comprising laminating a first power supply layer, a first signal layer, a first ground layer, a second power supply layer, a second signal layer, and a second ground layer one atop another in order through respective insulating layers;

providing a first wiring region for one of a power supply connection and a ground connection in the predetermined area on said first signal layer; and providing a second wiring region for the other of the power supply connection and a ground connection in the free area on said second signal layer.

10. The method according to claim 9, comprising the steps of:

connecting said first wiring region to a through hole for the one of the power supply connection and the ground connection, disposed in the vicinity of said first wiring region; and connecting said second wiring region to a through hole for the other of the power supply connection and the ground connection, disposed in the vicinity of said second wiring region.

* * * * *

UNITED STATES PATENT AND TRADEMARK OFFICE
CERTIFICATE OF CORRECTION

PATENT NO. : 8,451,619 B2  
APPLICATION NO. : 13/026965  
DATED : May 28, 2013  
INVENTOR(S) : Kashiwakura

Page 1 of 1

It is certified that error appears in the above-identified patent and that said Letters Patent is hereby corrected as shown below:

In the Claims

Claim 1, Col. 9, line 49, "re ion" should be --region--.

Signed and Sealed this
Nineteenth Day of August, 2014

Michelle K. Lee
*Deputy Director of the United States Patent and Trademark Office*